United States Patent [19]

Shyu et al.

[11] Patent Number: 5,724,095
[45] Date of Patent: Mar. 3, 1998

[54] CHARGE AMPLIFIER FOR MOS IMAGING ARRAY AND METHOD OF MAKING SAME

[75] Inventors: Tai-Ching Shyu, Cupertino; Datong Chen, Fremont, both of Calif.

[73] Assignee: OmniVision Technologies Inc., San Jose, Calif.

[21] Appl. No.: 538,441

[22] Filed: Oct. 3, 1995

[51] Int. Cl.$^6$ .................................................. H04N 5/335
[52] U.S. Cl. .................................. 348/300; 348/241; 330/9
[58] Field of Search .................................. 348/207, 241, 348/243, 248, 249, 682, 683, 707, 691, 695, 696, 697, 300; 330/9, 51; H04N 5/335

[56] References Cited

U.S. PATENT DOCUMENTS

| | | | |
|---|---|---|---|
| 4,439,693 | 3/1984 | Lucas et al. | 330/9 |
| 4,577,230 | 3/1986 | Ozawa et al. | 348/248 |
| 5,345,266 | 9/1994 | Denyer . | |
| 5,473,660 | 12/1995 | Bastiaens et al. | 348/241 |

OTHER PUBLICATIONS

Kawashima, H. et al., A 1/4 inch format 250K pixel amplified MOS image sensor using CMOS process, *IEDM*, pp. 575–578, 1993.

Ozaki, T. et al., A low–noise line–amplified MOS imaging devices, *IEEE*, pp. 969–975, 1991.

*Primary Examiner*—Andrew Faile
*Assistant Examiner*—Tuan V. Ho
*Attorney, Agent, or Firm*—Christensen O'Connor Johnson & Kindness

[57] ABSTRACT

A charge amplifier with DC offset cancelling for use in a pixel element of an MOS image sensor is disclosed. The charge amplifier can be manufactured using a standard CMOS single polycrystalline process, making it much more cost effective than prior art designs. The charge amplifier includes an operational amplifier, a source capacitor, a series capacitor, and a feedback capacitor. The source capacitor holds the input signal. The output of the operational amplifier provides the output signal. Switches control the routing of the signal flow from the source capacitor, the series capacitor, and the feedback capacitor.

8 Claims, 10 Drawing Sheets

5,724,095

CHARGE AMPLIFIER FOR MOS IMAGING ARRAY AND METHOD OF MAKING SAME

FIELD OF THE INVENTION

The present invention relates to metal oxide semiconductor imaging arrays, and more particularly, an improved charge amplifier for use in the array.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low cost and small hand-held video cameras. Nevertheless, the solid-state CCD integrated circuits needed for imaging are relatively difficult to manufacture, and therefore are expensive. In addition, because of the differing processes involved in the manufacture of CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

An alternative low cost technology to CCD integrated circuits is the metal oxide semiconductor (MOS) integrated circuit. Not only are imaging devices using MOS technology less expensive to manufacture relative the CCD imaging devices, for certain applications MOS devices are superior in performance. For example, the pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

Examples of MOS imaging devices are detailed in "A ¼ Inch Format 250K Pixel Amplified MOS Image Sensor Using CMOS Process" by Kawashima et al., *IEDM* 93–575 (1993), and "A Low Noise Line-Amplified MOS Imaging Devices" by Ozaki et al., *IEEE Transactions on Electron Devices*, Vol. 38, No. 5, May 1991. In addition, U.S. Pat. No. 5,345,266 to Denyer titled "Matrix Array Image Sensor Chip" describes a MOS image sensor. The devices disclosed in these publications provide a general design approach to MOS imaging devices.

The primary building block of an image formed by an MOS imaging device is a pixel. The number, size and spacing of the pixels determine the resolution of the image generated by the imaging device. The pixels of a MOS imaging device are semiconductor devices that transform incident light photons into current signals. The signal produced by each pixel is generally extremely small, in the nanoampere range. This small signal is unsuitable for further processing. Thus, a critical component of a MOS image sensor is a series of charge amplifiers that amplify the signals generated by the pixel elements. It is the charge amplifier design and the method of making the same that is the subject of the present invention.

SUMMARY OF THE INVENTION

The present invention is a charge amplifier with DC offset cancelling for use in a MOS image sensor. The charge amplifier can be manufactured using a standard CMOS single polycrystalline process, making it much more cost effective than prior art designs. The charge amplifier includes an operational amplifier, a feedback capacitor, a source capacitor, a series capacitor, and several switches (preferably formed from MOS transistors). In addition, a voltage reference is provided to cancel the offset voltage of the operational amplifier. The series capacitor is connected to the negative terminal of the operational amplifier. The positive terminal of the operational amplifier is connected to the voltage reference. The switches operate to alternately route the feedback signal through the series capacitor before being fed to the negative terminal or provide the feedback signal directly to the negative terminal. In the first instance, where the switches operate to route the feedback signal through the series capacitor, the DC offset voltage inherent to the operational amplifier is captured by the series capacitor. In the second instance, where the switches operate to route the feedback signal directly to the negative input, the voltage captured by the series capacitor cancels the DC offset voltage inherent to the operational amplifier.

In accordance with other aspects of the present invention, a capacitor for use in the charge amplifier comprises two series MOS transistors and a control MOS transistor. The gates of the two series MOS transistors are connected to the drain of the control MOS transistor. The drain and source of both of the series MOS transistors are tied together to form the two terminals of the capacitor, respectively. A control signal activates the control transistor to activate the capacitor for operation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
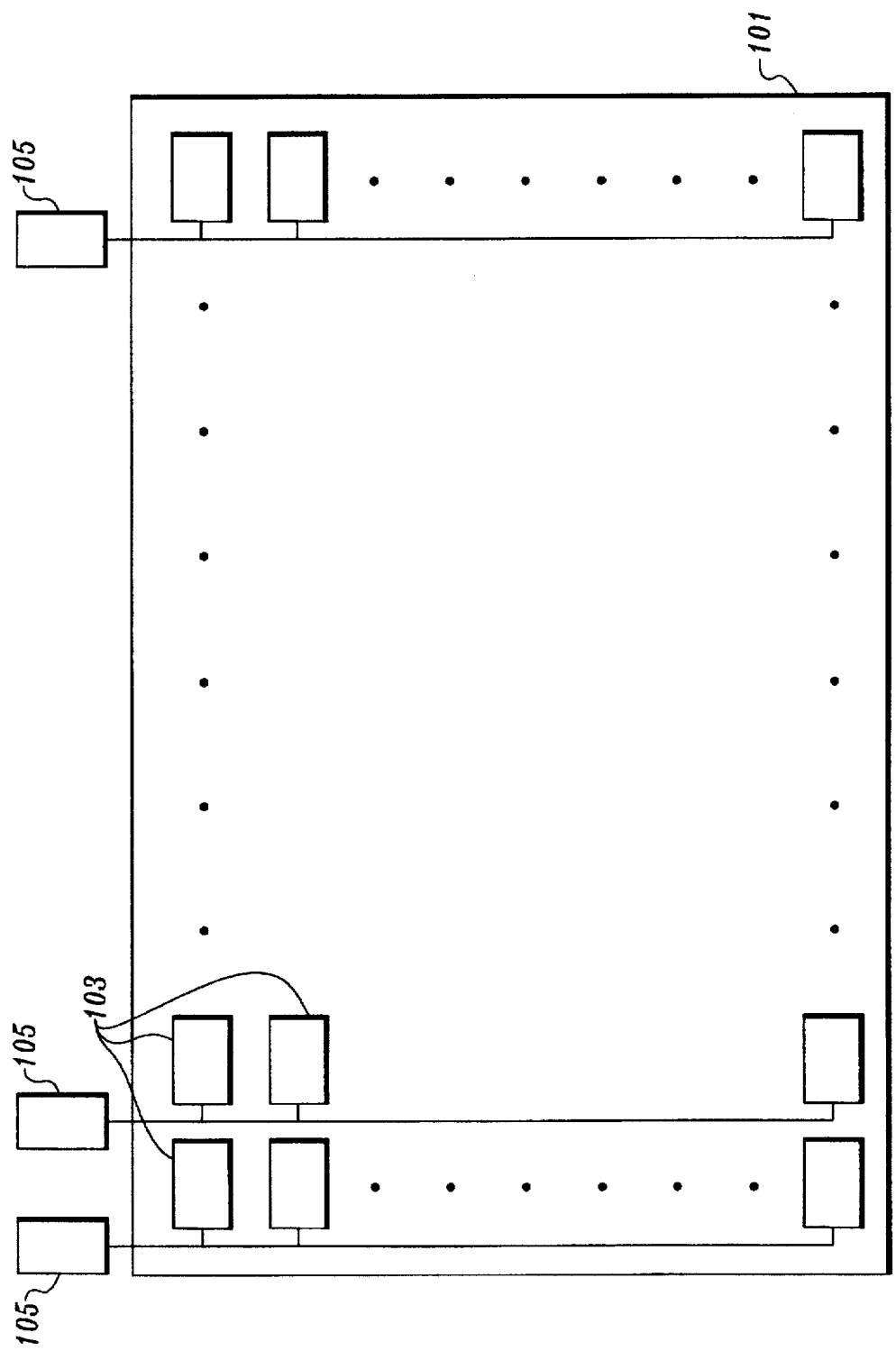
FIG. 1 is a schematic diagram of a CMOS imaging sensor.

With reference to FIG. 1, a CMOS imaging array 101 in accordance with the present invention includes a rectangular matrix of pixels 103. The number of pixels in the horizontal or x-direction, and the number of pixels in the vertical or y-direction, constitutes the resolution of the imaging array 101. Each of the pixels 103 in a vertical column routes its signal to a single charge amplifier 105 (shown in greater detail in FIG. 2). However, at any instant only one of the pixels 105 in a column sends a charge signal to the associated charge amplifier 105. Control circuitry of conventional design is operative to sequentially read the pixels 103 in a scanning manner.

Figure 2:
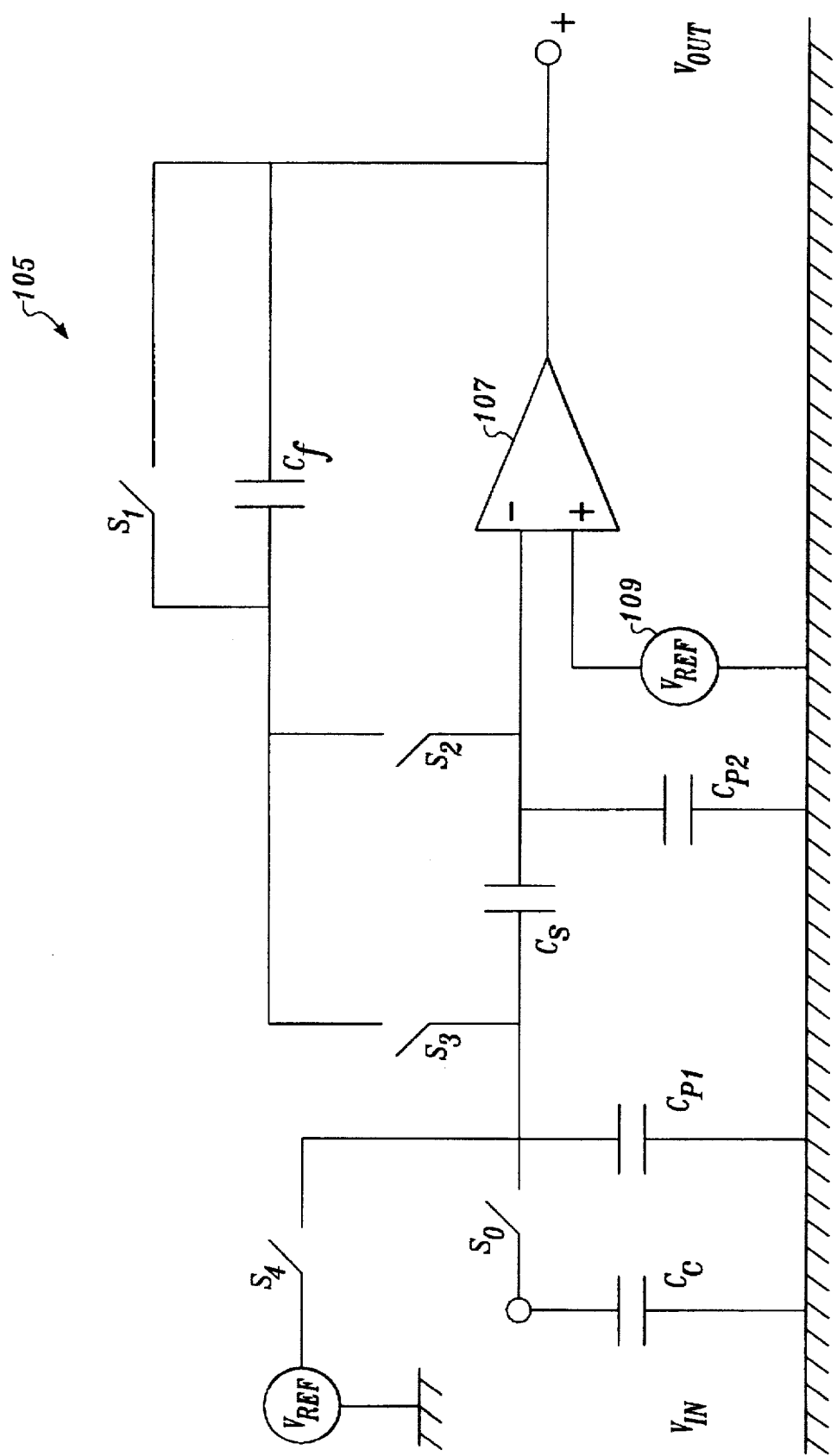
FIG. 2 is a schematic diagram of a CMOS charge amplifier in accordance with the present invention.

As seen in FIG. 2, each charge amplifier 105 includes an operational amplifier 107, and a reference voltage source 109 connected between ground and the positive input of the operational amplifier. A source capacitor $C_C$ and a series capacitor $C_S$ are connected in series between ground and the negative input of the operational amplifier. Also represented are two parasitic capacitances $C_{P1}$ and $C_{P2}$. As can be appreciated, the parasitic capacitances are not intentionally formed capacitors, but rather a result of the source capacitor $C_C$ and the series capacitor $C_S$. A feedback capacitor $C_F$ is connected between the negative input and the output of the operational amplifier. In the preferred embodiment and as detailed below, the capacitors are formed by MOS devices. As described below, switches $S_0-S_4$ control the routing of the input signal ($V_{IN}$), reference voltage signal ($V_{REF}$) and feedback signal through the amplifier.

In a traditional design for a charge amplifier that includes an operational amplifier, one challenge is the reduce the uncertainty in the DC offset voltage between the negative input (also referred to as the inverting input) and positive input (also referred to as the non-inverting input) of the operational amplifier. As is known in the art, the DC offset voltage between the two inputs of an operational amplifier is an unavoidable but, usually, undesirable artifact of the design and manufacture of an operational amplifier. In some circumstances, the presence of a DC offset voltage in the charge amplifiers 105 would be acceptable i.e., if all of the DC offset voltages in the operational amplifiers were equal in magnitude and polarity. However, because of variations in manufacture of the operational amplifiers, the DC offset voltage will vary from operational amplifier to operational amplifier. The uncertainty of the DC offset voltage between operational amplifiers, and thus the charge amplifiers 105, interferes with the performance and integrity of the image formed by the MOS imaging array. The present invention provides a charge amplifier 105 that eliminates or greatly lessens the effect of variable DC offset voltages.

Still referring to FIG. 2, the transfer function of the charge amplifier 105 can be calculated using known relationships. If the open loop gain (denoted as $A_V$) of the operational amplifier 107 is sufficiently high such that $A_V C_F$ is much larger than $C_{P1}$ and if $C_S$ is much larger than $C_{P2}$, then the final gain is approximated as:

$$V_{OUT}=V_{IN}*(C_C/C_F)-V_{REF} \qquad \text{Eq. (1)}$$

The inclusion of a reference voltage $V_{REF}$ shifts the entire input signal $V_{IN}$ to a higher magnitude for easier processing. Specifically, because the input signal $V_{IN}$ is typically very small, near a voltage level of ground, it is difficult for the operational amplifier 107 to process the signal. By shifting the input signal $V_{IN}$ to a higher magnitude (where the input signal piggybacks onto the $V_{REF}$ signal), the operational amplifier 107 can operate at a more optimum range. In addition, this allows the operational amplifier used in the imaging array 101 to operate on a single power supply. Thus, although a reference voltage $V_{REF}$ is included in the preferred embodiment, it can be appreciated by those skilled in the art that $V_{REF}$ may be a ground signal (i.e. grounded).

Figure 2A:
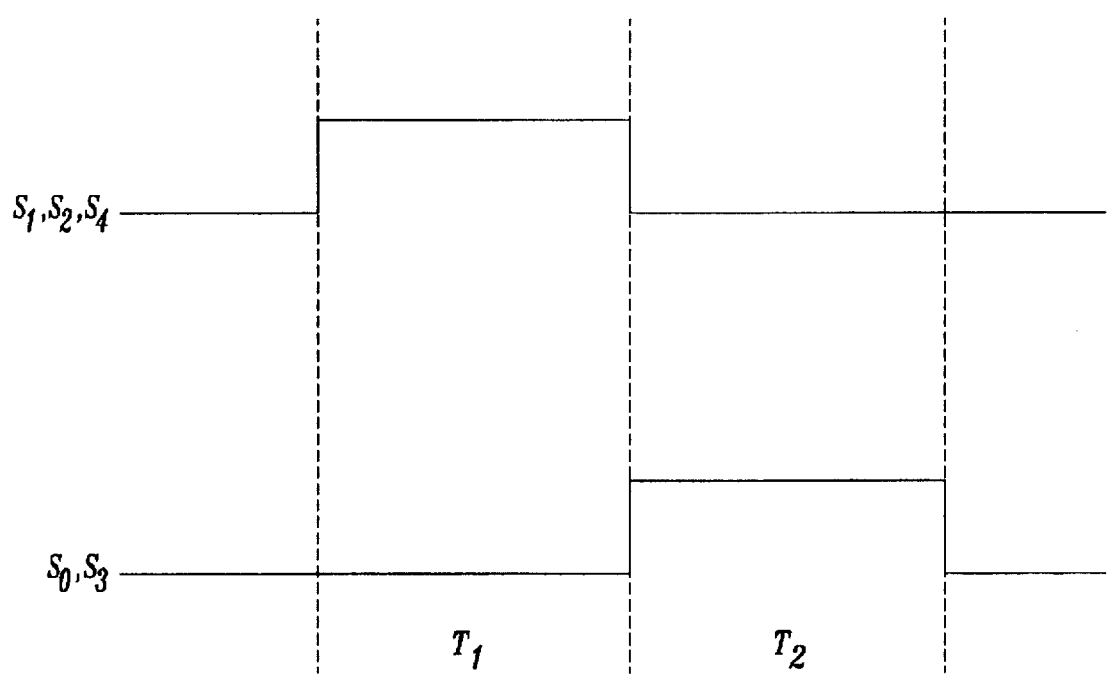
FIG. 2A is a timing diagram illustrating the operation of the CMOS charge amplifier of FIG. 2.

The inclusion of series capacitor $C_S$ in conjunction with controlled operation of the switches is operative to cancel any DC offset voltage in the operational amplifier. Switch $S_1$ is in parallel with feedback capacitor $C_F$; switch $S_2$ is between the negative input of the operational amplifier and the input side of feedback capacitor $C_F$; switch $S_3$ is between the input side of $C_F$ and a node between $C_S$ and $C_{P1}$; switch $S_4$ is between the reference voltage source and the node between $C_S$ and $C_{P1}$; and switch $S_0$ is between the source capacitor $C_C$ and the node between $C_S$ and $C_{P1}$ (i.e., in the path between the source capacitor $C_C$ and the series capacitor $C_S$). FIG. 2A is a timing diagram of the charge amplifier 105 when in operation. In particular, during time $T_1$, switches $S_1$, $S_2$, and $S_4$ are closed and switches $S_0$ and $S_3$ are open. The closing of switches $S_1$ and $S_2$ bypasses the feedback capacitor and connects the output of operational amplifier 107 directly to the negative input of operational amplifier 107. Closing of switch $S_4$ holds the input side of series capacitor at $V_{REF}$.

Figure 2B:
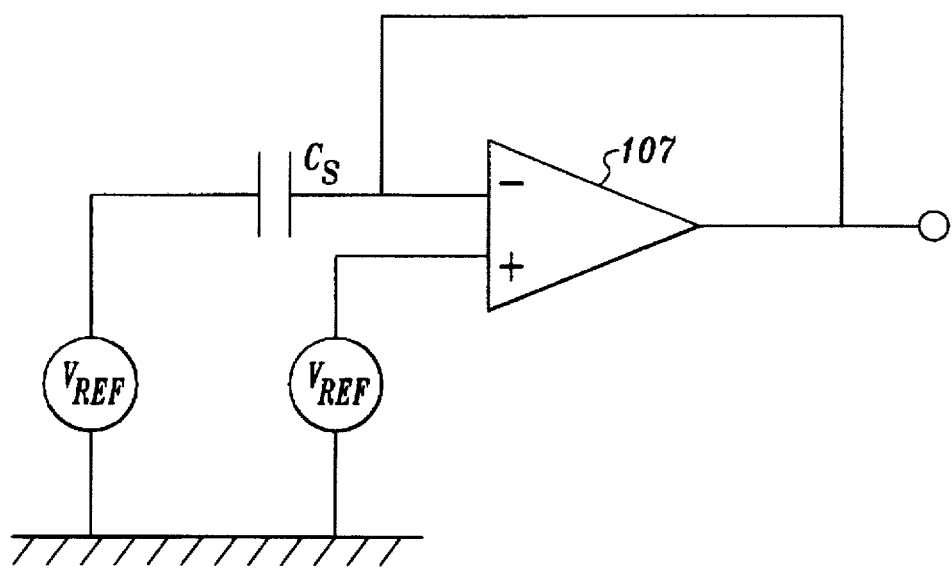
FIG. 2B is a circuit diagram illustrating the charge amplifier of FIG. 2 during a preparation period.

Because the positive input of operational amplifier 107 is held to voltage $V_{REF}$ and the input side of series capacitor $C_S$ is also held to voltage $V_{REF}$, the circuit performs as shown in FIG. 2B (ignoring the inconsequential effects of $C_{P1}$ and $CP_2$). The voltage across series capacitor $C_S$ is equal in magnitude to the DC offset voltage between the inputs of the operational amplifier 107. It should be noted that the input side of $C_S$ is held at $V_{REF}$ while the output side of $C_S$ is connected to the negative input of the operational amplifier. Thus, it can be said that the series capacitor $C_S$ stores a voltage that is equal to the DC offset voltage, and of opposite polarity. The time period $T_1$ during which switches $S_1$, and $S_2$ and $S_4$ are closed is referred to as the preparation period, because during time period $T_1$, the charge amplifier 105 is preparing to acquire and amplify the input signal $V_{IN}$.

Figure 2C:
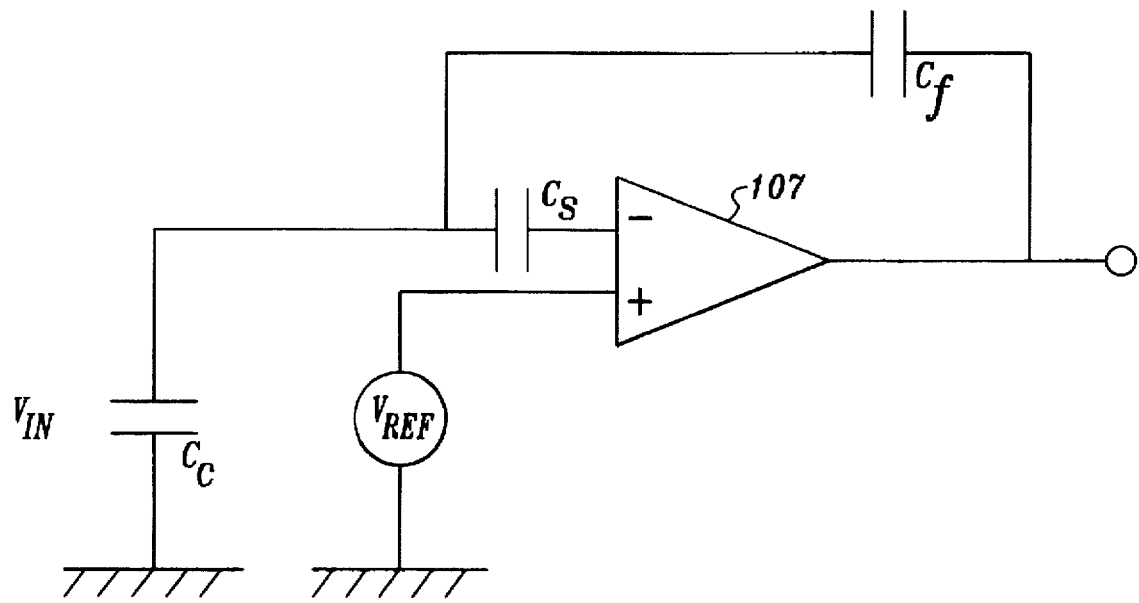
FIG. 2C is a circuit diagram illustrating the charge amplifier of FIG. 2 during a amplification period.

Next, at time $T_2$, switches $S_1$, $S_2$, and $S_4$ are opened and switches $S_0$ and $S_3$ are closed. The circuit performs as shown in FIG. 2C (again ignoring the inconsequential effects of $C_{P1}$ and $C_{P2}$). The input signal $V_{IN}$ is fed through the series capacitor $C_S$ to the operational amplifier 107. The feedback signal flows through the feedback capacitor $C_F$. As can be appreciated, this configuration is a normal amplification arrangement for the input signal $V_{IN}$. Any DC offset voltage in operational amplifier 107 is momentarily cancelled by the equal and opposite voltage stored across series capacitor $C_S$, obtained during the preparation period. The time period $T_2$ when switches $S_1$ and $S_3$ are closed is referred to as the amplification period because during time period $T_2$, the charge amplifier 105 is amplifying the input signal $V_{IN}$. Thus, as can be seen, the charge amplifier 105, by inclusion of series capacitor $C_S$ and the switching mechanisms, is operative to cancel any DC offset voltage inherent in the operational amplifier 107 for the very brief period of actuation of a pixel.

Another issue that arises is the manufacture in MOS processes the capacitors $C_S$ and $C_F$. In particular, in order to manufacture the charge amplifier 105 that behaves in accordance with Eq. (1), large and stable capacitors $C_S$ and $C_F$ must be available. In the prior art, there are three methods of manufacturing capacitors using VLSI process. First, a capacitor (known as a junction capacitor) could be formed by the junction of a pn diode. However, as can be appreciated by those skilled in the art, this capacitor is difficult to use and its capacitance value varies as the voltage across the junction capacitor changes.

The second type of capacitor is referred to as the MOS channel capacitor. The source and drain of a MOS transistor are tied together. The gate serves as one "plate" of the capacitor and the source/drain-combination as the other "plate" of the capacitor. The oxide material serves as the dielectric. This MOS channel capacitor suffers from the same disadvantages as the junction capacitor, namely, the capacitance of the MOS channel capacitor varies as a function of the voltage across the capacitor.

Finally, the third type of capacitor is referred to as the poly2 to poly1 capacitor. This capacitor involves the inclusion of two polycrystalline materials in proximity to each other. This type of capacitor requires extra manufacturing steps due to the requirement of a second polycrystalline material. In addition, the capacitance is relatively low compared to the amount of integrated circuit space necessary to fabricate such a capacitor. Moreover, the capacitance does not relate to any other MOS parameters.

Figure 3:
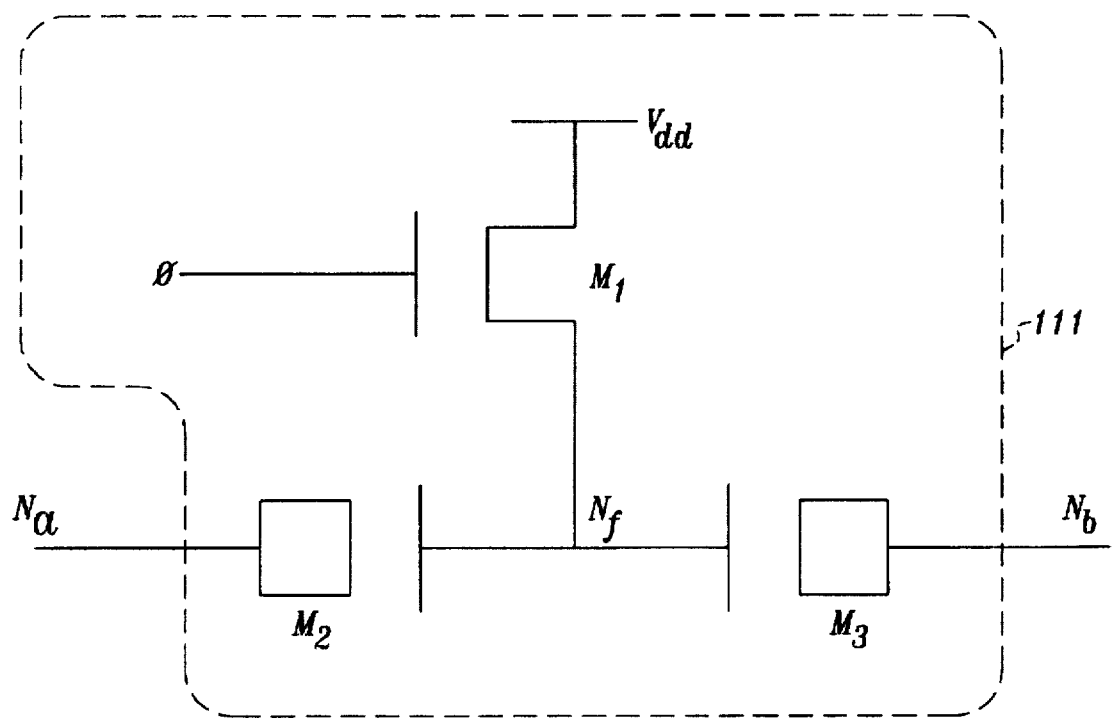
FIG. 3 is a circuit diagram of a capacitor formed using an NMOS process for use in the charge amplifier of FIG. 2.

FIG. 3 illustrates a new design for a large stable capacitor that does not suffer from any of the disadvantages of the other prior art MOS capacitors. The capacitor is formed from three MOS transistors $M_1$, $M_2$, and $M_3$. The gates of transistors $M_2$ and $M_3$ are tied together, along with the drain of transistor $M_1$. The source of transistor $M_1$ is connected to a voltage source $V_{dd}$. In the preferred embodiment, $V_{dd}$ is set to 5.0 volts.

Figure 3A:
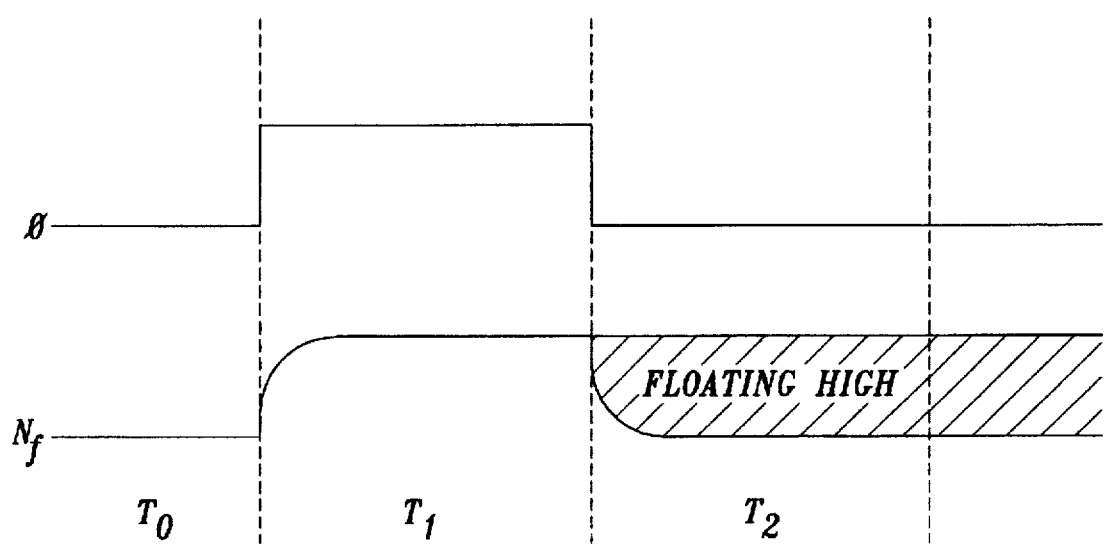
FIG. 3A is a timing diagram illustrating the operation of the capacitor of FIG. 3.

The operation of the capacitor can be explained in connection with the timing diagram of FIG. 3A. At time $T_1$, transistor $M_1$ is turned on by a signal $\phi$. This causes node $N_f$ to reach a voltage equal to $V_{dd}-V_t$, where $V_t$ is the threshold voltage of transistor $M_1$. At time $T_2$, transistor $M_1$ is turned off. This causes the voltage at node $N_f$ to float at $V_{dd}-V_t$. A capacitor is then formed by the transistors $M_2$ and $M_3$ in series. In such a manner, an easy to fabricate capacitor is provided. However, this design has the disadvantage of a limited operating range. For example, the voltages at nodes $N_a$ and $N_b$ must be lower than $V_{dd}-2*V_t$. If the voltages at these nodes rise above this level, the capacitance of the MOS channel capacitor depletes.

Figure 4:
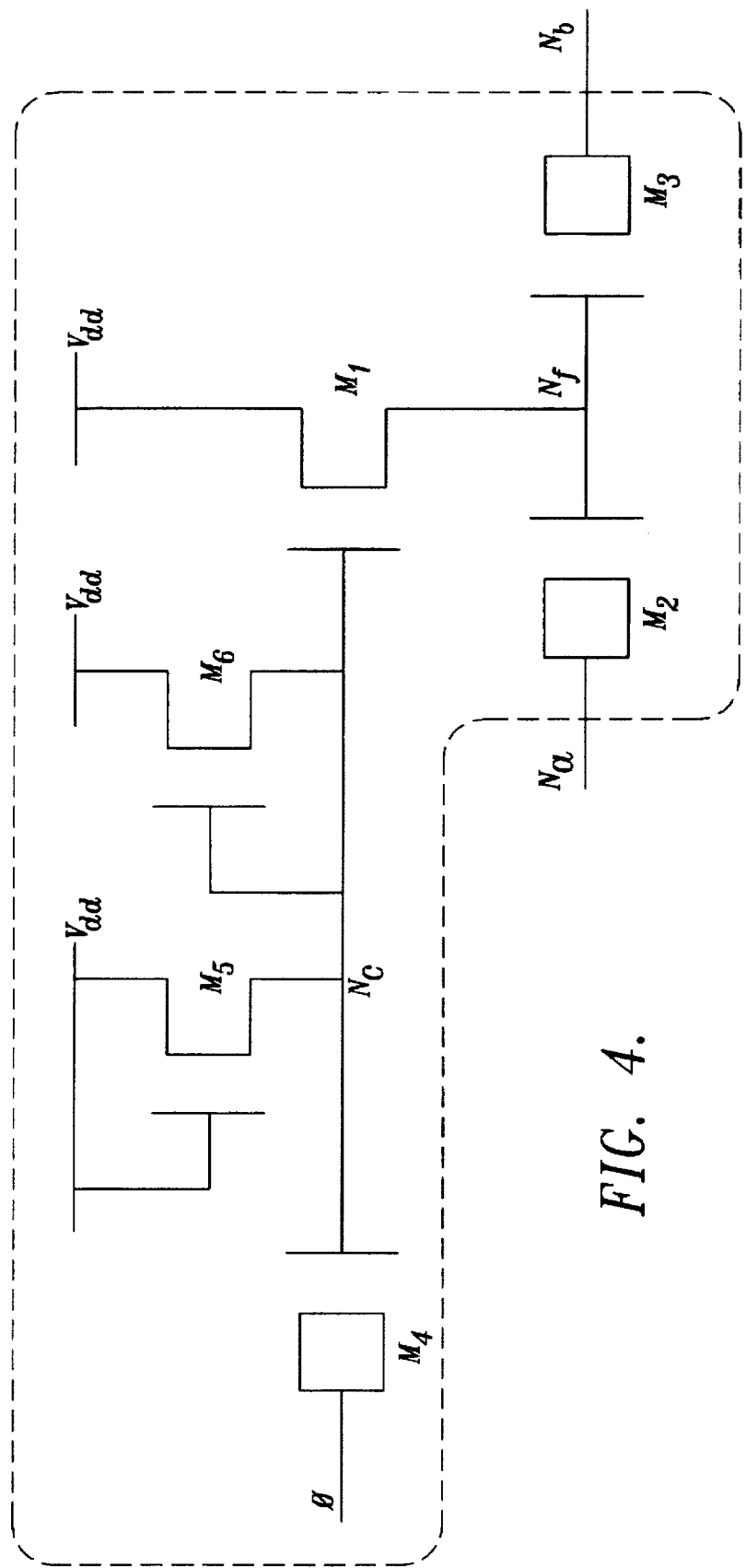
FIG. 4 is a schematic diagram of an alternative embodiment of a capacitor using an NMOS process for use in the charge amplifier of FIG. 2.

To remedy the limited operating range of the embodiment of FIG. 3, the design of FIG. 4 is provided. FIG. 4 provides a similar arrangement to the capacitor of FIG. 3 with the addition of transistors $M_4$, $M_5$, and $M_6$. As seen, the drains of transistors $M_5$ and $M_6$ are tied to the gate of transistor $M_1$. Further, the gates of transistors $M_4$ and $M_6$ are tied to the gate of transistor $M_1$. The gate of transistor $M_5$ is tied to $V_{dd}$. Finally, transistor $M_4$ is configured into a MOS channel capacitor configuration, i.e., the source and drain of transistor $M_4$ are tied together. In the preferred embodiment, transistors $M_4-M_6$ are sharable amongst a plurality of capacitors. Thus, a plurality of combinations of transistors $M_1-M_3$ can share the transistors $M_4-M_6$. To put it another way, the combination of $M_4-M_6$ provide an output that can be routed to several of the combinations of $M_1-M_3$, thus forming several capacitors.

Figure 4A:
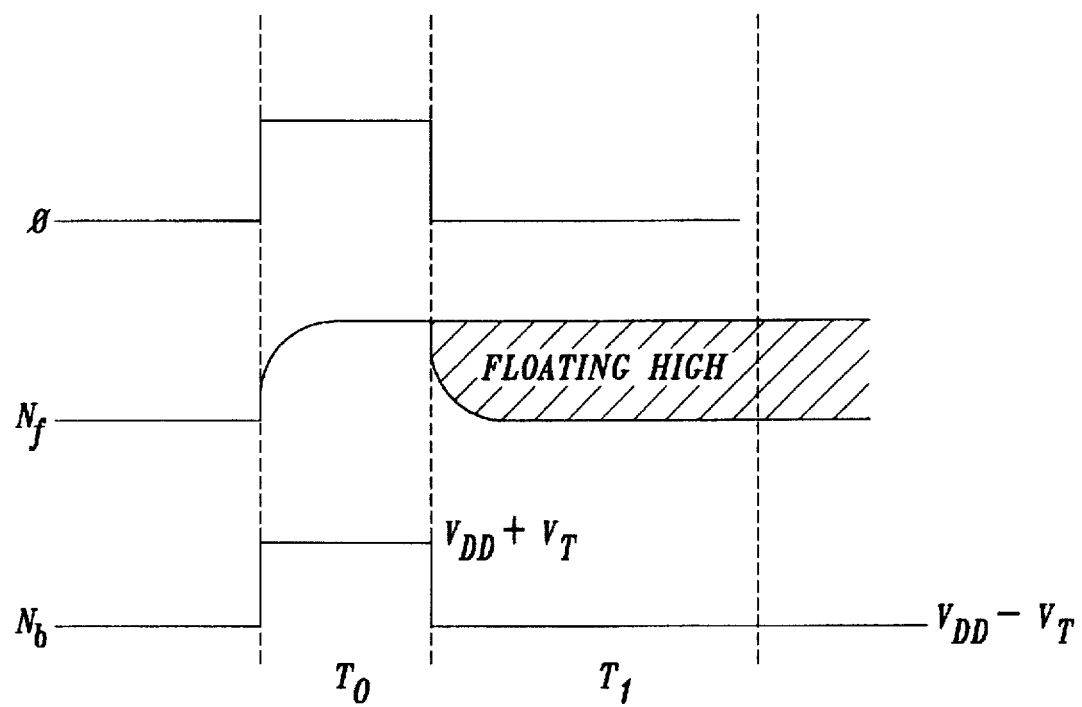
FIG. 4A is a timing diagram illustrating the operation of the capacitor of FIG. 4.

The operation of the capacitor can be understood with further reference to FIG. 4A. During time $T_0$, the signal $\phi$ is high which causes the voltage at node $N_c$ to become $V_{dd}-V_t$. As a consequence, the voltage at node $N_f$ is charged to $V_{dd}$. During time $T_1$, signal $\phi$ returns to low resulting in the voltage at node $N_c$ to be clamped at $V_{dd}-V_t$. The voltage at node $N_f$ is floating at $V_{dd}$ and the capacitor is ready for use. The operating range of this capacitor becomes $V_{dd}-V_t$ for the upper limit and $V_{dd}-3*V_t$ for the lower limit, which is sufficient in many applications.

Figure 5:
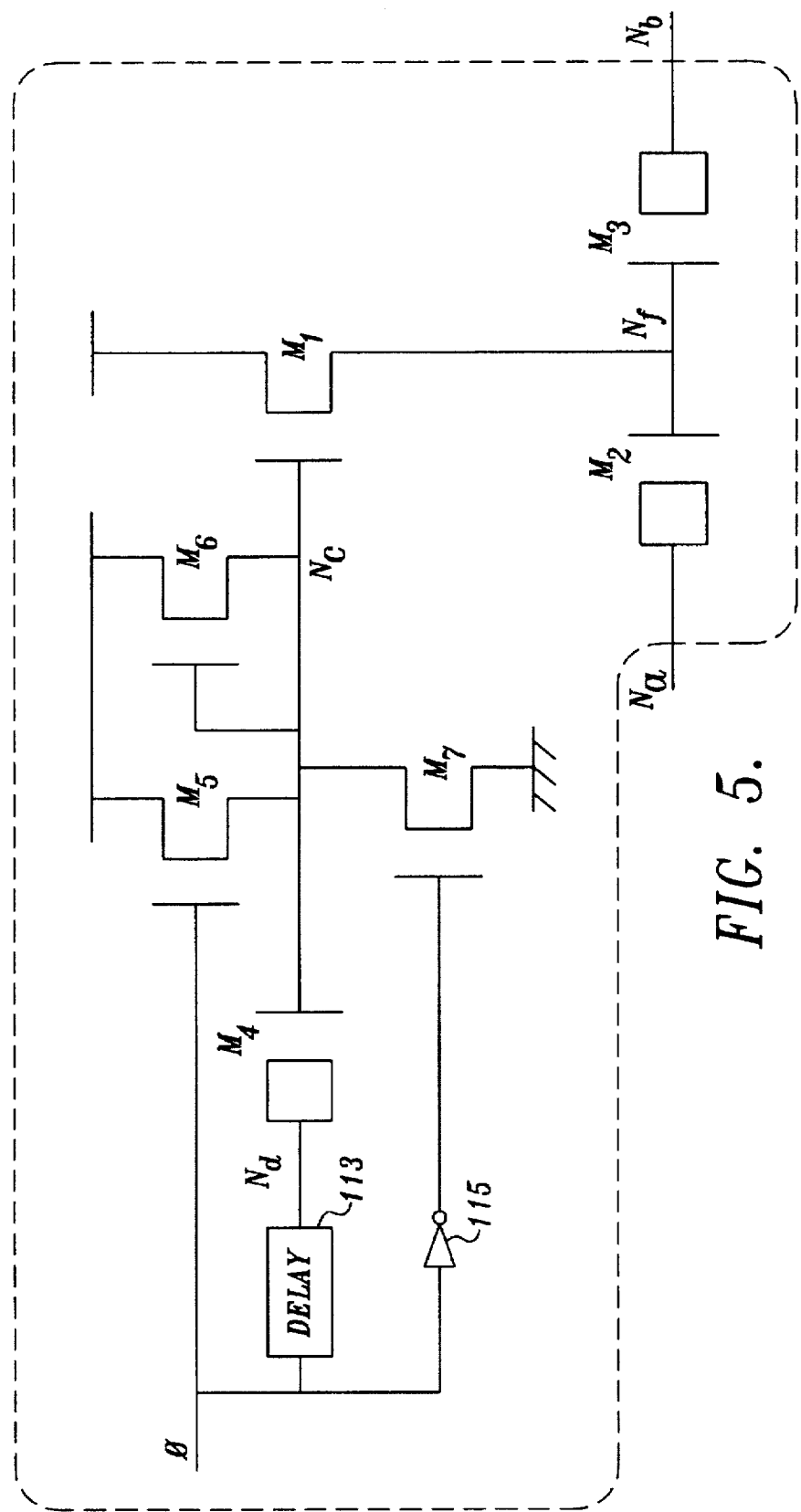
FIG. 5 is a schematic diagram of another alternative embodiment of a capacitor using an NMOS process for use in the charge amplifier of FIG. 2.
Figure 5A:
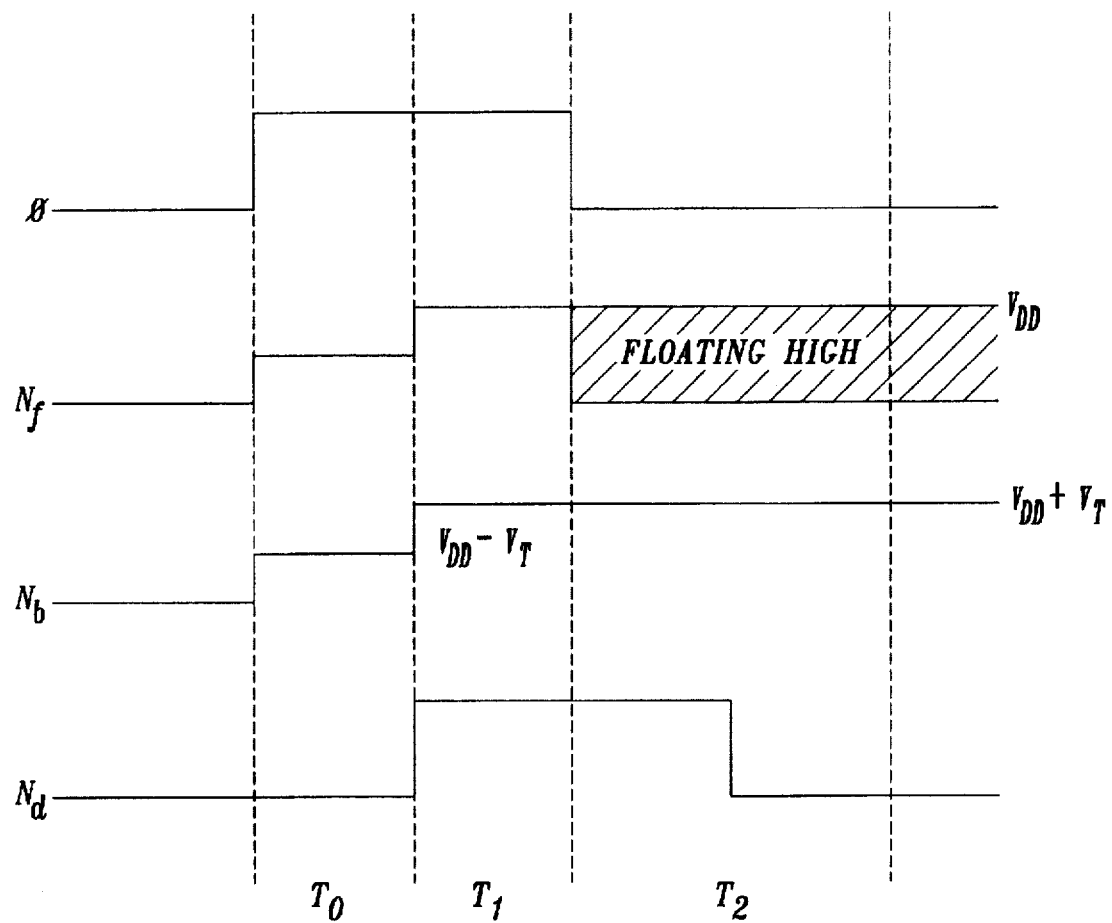
FIG. 5A is a timing diagram illustrating the operation of the capacitor of FIG. 5.

A further improved capacitor is seen in FIG. 5 which further includes a transistor $M_7$, a delay element 113 and an inverter 115. These additional elements are also shareable amongst a plurality of basic capacitors formed from transistors $M_1-M_3$. In operation, referring to FIG. 5A, during time $T_0$, signal $\phi$ goes high and the voltage at node $N_c$ is charged to $V_{dd}-V_t$. After a delay caused by delay 113, during time $T_1$, the voltage at node $N_c$ is boosted to $V_{dd}+V_t$. This charges the voltage at node $N_f$ to $V_{dd}$. During time $T_2$, signal phi returns to low and transistor $M_7$ is turned on. This in turn causes the voltage at node $N_c$ to discharge to ground, which completely shuts off transistor $M_1$. Further, the voltage at node $N_f$ is floating at $V_{dd}$. This capacitor can operate throughout the entire supply range from zero to $V_{dd}$.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An improved charge amplifier for amplifying an input charge signal and providing an amplified output signal, said charge amplifier comprising:
   an operational amplifier having an output terminal for communicating said output signal, a negative input, and a positive input;
   a feedback capacitor for routing said output signal to said negative input;
   a series capacitor having a first and a second terminal, said first terminal connected to said negative input and said second terminal adapted to receive said input charge signal;
   a first switch mechanism for routing said output signal directly to said negative input during a preparation period to said negative input, said first switch mechanism also holding the voltage of said second terminal at substantially the same level as the voltage of said positive input; and
   a second switching mechanism for routing said output signal through said feedback capacitor and through said series capacitor to said negative input during an amplification period, said second switching mechanism also routing said input charge signal through said series capacitor to said negative input.

2. The charge amplifier of claim 1 further including a voltage reference connected to said positive input, said voltage reference also connected to said second terminal during said preparation period.

3. The charge amplifier of claim 1 further wherein said input charge signal is held by a source capacitor.

4. The charge amplifier of claim 2 further wherein said input charge signal is held by a source capacitor.

5. The charge amplifier of claim 1 further wherein said series capacitor and said feedback capacitor is formed from a MOS capacitor including
   a first series MOS transistor having a gate, a drain, and a source, said drain and said source of said first series MOS transistor tied together to form said input terminal;
   a second series MOS transistor having a gate, a drain, and a source, said drain and source of said second series MOS transistor tied together to form said output terminal, said gate of said second MOS transistor tied to the gate of said first MOS transistor; and
   a control MOS transistor having a gate, a drain, and a source, said drain of said control MOS transistor tied to said gates of said first and second series MOS transistors, said source of said control MOS transistor connected to a driving voltage source;
   whereby a control signal is applied to the gate of said control MOS transistor to activate said MOS capacitor.

6. The charge amplifier of claim 2 further wherein said series capacitor and said feedback capacitor is formed from a MOS capacitor including a first series MOS transistor having a gate, a drain, and a source, said drain and said source of said first series MOS transistor tied together to form said input terminal;

a second series MOS transistor having a gate, a drain, and a source, said drain and source of said second series MOS transistor tied together to form said output terminal, said gate of said second MOS transistor tied to the gate of said first MOS transistor; and a control MOS transistor having a gate, a drain, and a source, said drain of said control MOS transistor tied to said gates of said first and second series MOS transistors, said source of said control MOS transistor connected to a driving voltage source;

whereby a control signal is applied to the gate of said control MOS transistor to activate said MOS capacitor.

7. The charge amplifier of claim 3 further wherein said series capacitor and said feedback capacitor is formed from a MOS capacitor including a first series MOS transistor having a gate, a drain, and a source, said drain and said source of said first series MOS transistor tied together to form said input terminal;

a second series MOS transistor having a gate, a drain, and a source, said drain and source of said second series MOS transistor tied together to form said output terminal, said gate of said second MOS transistor tied to the gate of said first MOS transistor; and a control MOS transistor having a gate, a drain, and a source, said drain of said control MOS transistor tied to said gates of said first and second series MOS transistors, said source of said control MOS transistor connected to a driving voltage source;

whereby a control signal is applied to the gate of said control MOS transistor to activate said MOS capacitor.

8. A MOS imaging array comprising:

a plurality of photosensitive pixels formed in an array, said pixels providing a charge signal in response to irradiation by light; and a plurality of charge amplifiers, one of said amplifiers associated with at least one of said pixels, said charge amplifier comprising (a) an operational amplifier having an output terminal for communicating an output signal, a negative input, and a positive input;

(b) a feedback capacitor for routing said output signal to said negative input;

(c) a series capacitor having a first and a second terminal, said first terminal connected to said negative input and said second terminal adapted to receive said charge signal;

(d) a first switch mechanism for routing said output signal directly to said negative input during a preparation period to said negative input, said first switch mechanism also holding the voltage of said second terminal at substantially the same level as the voltage of said positive input; and (e) a second switching mechanism for routing said output signal through said feedback capacitor and through said series capacitor to said negative input during an amplification period, said second switching mechanism also routing said charge signal through said series capacitor to said negative input.

* * * * *